(12) United States Patent
Nuttall et al.

(10) Patent No.: US 7,923,322 B2
(45) Date of Patent: *Apr. 12, 2011

(54) METHOD OF FORMING A CAPACITOR

(75) Inventors: Michael Nuttall, Meridian, ID (US);
Er-Xuan Ping, Boise, ID (US); Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 995 days.

This patent is subject to a terminal disclaimer.

(21) Appl. No.: 11/234,328

(22) Filed: Sep. 23, 2005

(65) Prior Publication Data

US 2006/0019442 A1    Jan. 26, 2006

Related U.S. Application Data

(60) Continuation of application No. 10/863,046, filed on Jun. 7, 2004, now Pat. No. 7,049,231, which is a division of application No. 10/050,426, filed on Jan. 15, 2002, now Pat. No. 6,797,558, which is a division of application No. 09/843,116, filed on Apr. 24, 2001, now Pat. No. 6,458,699, which is a division of application No. 09/429,236, filed on Oct. 28, 1999, now Pat. No. 6,509,239, which is a division of application No. 09/023,239, filed on Feb. 13, 1998, now Pat. No. 6,159,852.

(51) Int. Cl.
*H01L 21/8242* (2006.01)

(52) U.S. Cl. ......... 438/239; 438/674; 438/680; 438/684

(58) Field of Classification Search ................... 438/239, 438/250, 674, 680, 684; 257/E21.001
See application file for complete search history.

(56) References Cited

U.S. PATENT DOCUMENTS

| | | | |
|---|---|---|---|
| 4,497,683 A | 2/1985 | Celler et al. | |
| 4,722,912 A | 2/1988 | Flatley et al. | |
| 4,901,128 A | 2/1990 | Sunami et al. | |
| 4,948,755 A | 8/1990 | Mo | |
| 4,963,506 A | 10/1990 | Liaw et al. | |
| 4,966,868 A | 10/1990 | Murali et al. | |
| 5,006,911 A | 4/1991 | Sivan | |
| 5,037,775 A | 8/1991 | Reisman | |

(Continued)

OTHER PUBLICATIONS

Violette, Katherine et al., *Low Temperature Selective Silicon Epitaxy by Ultra High Vacuum Rapid Thermal Chemical Vapor Deposition Using $Sl_2H_6$, $H_2$ and $Cl_2$*, 68 Appl. Phys. Lett. 66-68 (Jan. 1, 1996).

(Continued)

*Primary Examiner* — Jack Chen
(74) *Attorney, Agent, or Firm* — Wells St. John P.S.

(57) ABSTRACT

A method of forming a capacitor includes forming a first capacitor electrode over a substrate. A substantially crystalline capacitor dielectric layer is formed over the first capacitor electrode. The substrate with the substantially crystalline capacitor dielectric layer is provided within a chemical vapor deposition reactor. Such substrate has an exposed substantially amorphous material. A gaseous precursor comprising silicon is fed to the chemical vapor deposition reactor under conditions effective to substantially selectively deposit polysilicon on the substantially crystalline capacitor dielectric layer relative to the exposed substantially amorphous material, and the polysilicon is formed into a second capacitor electrode.

21 Claims, 6 Drawing Sheets

U.S. PATENT DOCUMENTS

| | | | |
|---|---|---|---|
| 5,080,933 A | 1/1992 | Grupen-Shemansky | |
| 5,110,757 A | 5/1992 | Arst et al. | |
| 5,118,639 A | 6/1992 | Roth et al. | |
| 5,124,276 A | 6/1992 | Samata et al. | |
| 5,227,651 A | 7/1993 | Kim et al. | |
| 5,364,815 A | 11/1994 | Osada | |
| 5,441,012 A | 8/1995 | Aketagawa et al. | |
| 5,607,878 A | 3/1997 | Otsuka et al. | |
| 5,646,073 A | 7/1997 | Grider et al. | |
| 5,663,098 A | 9/1997 | Creighton et al. | |
| 5,798,278 A | 8/1998 | Chan et al. | |
| 5,811,344 A * | 9/1998 | Tu et al. | 438/396 |
| 5,818,100 A | 10/1998 | Grider et al. | |
| 6,013,575 A | 1/2000 | Itoh | |
| 6,017,823 A | 1/2000 | Shishiguchi et al. | |
| 6,069,036 A | 5/2000 | Kim | |
| 6,159,852 A | 12/2000 | Nuttall et al. | |
| 6,218,288 B1 | 4/2001 | Li et al. | |
| 6,387,716 B1 | 5/2002 | Nuttall et al. | |
| 6,417,015 B2 | 7/2002 | Nuttall et al. | |
| 6,458,699 B1 | 10/2002 | Nuttall et al. | |
| 6,509,239 B1 | 1/2003 | Nuttall et al. | |
| 6,693,042 B1 | 2/2004 | Sedigh et al. | |
| 6,780,771 B1 | 8/2004 | Jayatilaka et al. | |
| 6,790,737 B2 | 9/2004 | Schneegans et al. | |
| 6,797,558 B2 * | 9/2004 | Nuttall et al. | 438/239 |
| 6,803,318 B1 | 10/2004 | Qiao et al. | |
| 6,893,974 B1 | 5/2005 | Sedigh et al. | |
| 6,967,154 B2 | 11/2005 | Meng et al. | |
| 7,049,231 B2 * | 5/2006 | Nuttall et al. | 438/674 |
| 7,108,746 B2 | 9/2006 | Zehavi et al. | |
| 7,137,546 B2 | 11/2006 | Zehavi et al. | |
| 7,157,792 B1 | 1/2007 | Yahatilaka et al. | |
| 2002/0048911 A1 | 4/2002 | Nuttall et al. | |
| 2002/0170487 A1 | 11/2002 | Zehavi et al. | |
| 2004/0224485 A1 | 11/2004 | Nuttall et al. | |
| 2006/0211218 A1 | 9/2006 | Boyle et al. | |
| 2007/0006799 A1 | 1/2007 | Zehavi et al. | |

OTHER PUBLICATIONS

Wolf, Stanley, Silicon Processing for the VLSI Era, vol. 1: Processing Technology, pp. 183 (1990).

Wolf, Stanley, Silicon Processing for the VLSI Era, vol. 2: Process Integration, pp. 45 (1990).

* cited by examiner

METHOD OF FORMING A CAPACITOR

RELATED PATENT DATA

This patent resulted from a continuation application of U.S. patent application Ser. No. 10/863,046, filed on Jun. 7, 2004 now U.S. Pat. No. 7,049,231, entitled "Methods of Forming Capacitors", naming Michael Nuttall, Er-Xuan Ping and Yongjun Jeff Hu as inventors, the disclosure of which is incorporated herein by reference; which resulted from a divisional application of U.S. patent application Ser. No. 10/050,426, filed on Jan. 15, 2002, entitled "Methods of Forming a Capacitor With Substantially Selective Deposit of Polysilicon on a Substantially Crystalline Capacitor Dielectric Layer", naming Michael Nuttall, Er-Xuan Ping, and Yongjun Jeff Hu as inventors, now U.S. Pat. No. 6,797,558 B2, the disclosure of which is incorporated herein by reference; which resulted from a divisional application of U.S. patent application Ser. No. 09/843,116, filed on Apr. 24, 2001, entitled "Methods of Forming a Contact to a Substrate", naming Michael Nuttall, Er-Xuan Ping and Yongjun Jeff Hu as inventors, now U.S. Pat. No. 6,458,699 B1, the disclosure of which is incorporated herein by reference; which resulted from a divisional application of U.S. patent application Ser. No. 09/429,236, filed on Oct. 28, 1999, entitled "Methods of Fabricating a Field Effect Transistor on a Substrate, naming Michael Nuttall, Er-Xuan Ping and Yongjun Jeff Hu as inventors, now U.S. Pat. No. 6,509,239 B1, the disclosure of which is incorporated herein by reference; which resulted from a divisional application of U.S. patent application Ser. No. 09/023,239, filed on Feb. 13, 1998, entitled "Method of Depositing Polysilicon, Method of Fabricating a Field Effect Transistor, Method of Forming a Contact to a Substrate, Method of Forming a Capacitor", naming Michael Nuttall, Er-Xuan Ping and Yongjun Jeff Hu as inventors, U.S. Pat. No. 6,159,852; the disclosure of which is incorporated herein by reference.

TECHNICAL FIELD

This invention relates to methods of depositing polysilicon, to methods of fabricating field effect transistors, to methods of forming contacts to substrates and to methods of forming capacitors.

BACKGROUND OF THE INVENTION

Device geometry continues to shrink in semiconductor circuitry fabrication. For example, field effect transistor gate width is now commonly below one micron and source/drain junction depth 1000 Angstroms or less. A challenge in such constructions is to reduce parasitic source/drain serial resistance while maintaining low source/drain diode leakage. Such resistance can be reduced by providing a thicker silicide over the source/drain. Such is typically provided by depositing a metal layer on the source/drain which typically comprises monocrystalline silicon. A subsequent anneal causes a reaction which consumes a portion of the silicon to form the silicide. However, large consumption of silicon to form the desired thicker silicide results in the silicide/junction interface being very close to the base of the junction. This causes source/drain diode leakage current to the substrate to increase.

Raised or elevated source/drain constructions in field effect transistors can be utilized to minimize or reduce the amount of silicon consumed in forming a silicide portion of a substrate contact. Further, raised source/drain constructions can provide desired field effect transistor constructions independent of the silicide contact which is typically formed. For example, raised source/drain transistors are commonly used in logic device applications where device speed is an important factor.

Elevated source/drain constructions are typically formed in the prior art by selectively growing epitaxial monocrystalline silicon atop the silicon junction regions. Such is typically accomplished in costly epitaxial reactors operating under ultra high vacuum (UHV), for example at vacuum pressures of the order of 0.001 mtorr. Violette et al., "Low temperature selective silicon epitaxy by ultra high vacuum rapid thermal chemical vapor deposition using $Si_2H_6$, $H_2$ and $Cl_2$", Applied Physics Letter 68(1), pp. 66-68, Jan. 1, 1996 disclose a selective epi silicon deposition process occurring at 800° C. and 30 mTorr or less.

It would be desirable to improve upon these and other prior art processes of selectively forming silicon over silicon substrates. Although motivated from this objective, the artisan will appreciate other applicability of the disclosed technology, with the invention only being limited by the accompanying claims appropriately interpreted in accordance with the Doctrine Of Equivalents.

SUMMARY OF THE INVENTION

In but one aspect of the invention, a method of depositing polysilicon comprises providing a substrate within a chemical vapor deposition reactor, with the substrate having an exposed substantially crystalline region and an exposed substantially amorphous region. A gaseous precursor comprising silicon is fed to the chemical vapor deposition reactor under conditions effective to substantially selectively deposit polysilicon on the crystalline region and not the amorphous region.

In another aspect a method of fabricating a field effect transistor on a substrate comprises forming a gate dielectric layer and a gate over semiconductive material. Doped source/drain regions are formed within semiconductive material laterally proximate the gate. Substantially amorphous insulating material is formed over and laterally proximate the gate. The substrate is provided within a chemical vapor deposition reactor. A gaseous precursor comprising silicon is fed to the chemical vapor deposition reactor under conditions effective to substantially selectively deposit polysilicon on the source/drain regions and not on substantially amorphous material, and forming elevated source/drains on the doped source/drain regions.

In but another aspect, a method of forming a contact to a substrate comprises forming substantially amorphous insulating material over a substrate node location. A contact opening is etched through the amorphous insulating material over the node location. The node location is provided to comprise an outwardly exposed substantially crystalline surface. The substrate with outwardly exposed substantially crystalline node location surface is provided within a chemical vapor deposition reactor. A gaseous precursor comprising silicon is fed to the chemical vapor deposition reactor under conditions effective to substantially selectively deposit polysilicon on the outwardly exposed crystalline node location surface and not on the insulating material.

An aspect of the invention also comprises forming a capacitor. In one implementation, a substrate is provided within a chemical vapor deposition reactor. The substrate has an exposed substantially crystalline region and an exposed substantially amorphous region. A gaseous precursor comprising silicon is fed to the chemical vapor deposition reactor under conditions effective to substantially selectively deposit polysilicon on the crystalline region and not the amorphous region, and the polysilicon is formed into a first capacitor electrode. A capacitor dielectric layer is formed over the polysilicon. A second capacitor electrode is formed over the capacitor dielectric layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In the prior art, polysilicon is typically deposited by chemical vapor deposition utilizing precursor gases, such as silane. Typical deposition temperatures are from 500° C. to 625° C. at a pressure ranging from 50 mTorr to 1 Torr. Deposition temperatures less than about 550° C. result in an amorphous deposition while deposition temperatures greater than 550° C. result in a polycrystalline deposition. Regardless, the deposition typically results in a uniform, conformal layer of silicon atop the semiconductor substrate.

Figure 1:
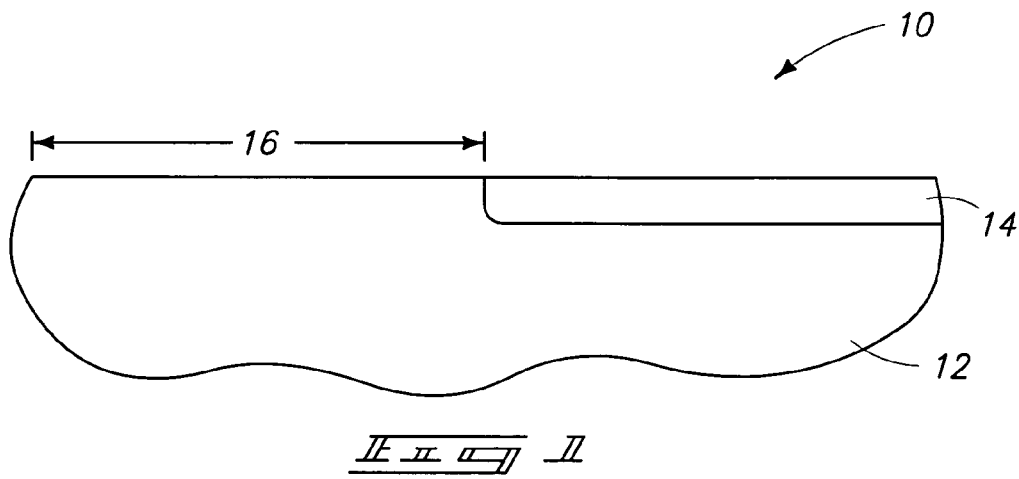
FIG. 1 is a diagrammatic view of a semiconductor wafer fragment at one process in accordance with the invention.

Referring to FIG. 1, a semiconductor wafer in process is indicated generally with reference numeral 10. Such comprises, for example, a bulk monocrystalline silicon substrate 12 having an exposed insulating dielectric layer or region 14 associated therewith, such as $SiO_2$ or $Si_3N_4$. Monocrystalline silicon 12 presents an exposed substantially crystalline region 16, while all of the illustrated dielectric material 14 constitutes an exposed substantially amorphous dielectric material region as depicted in FIG. 1. In the context of this document, "substantially crystalline" and "substantially amorphous" refer to the respective attributes at greater than 90% of the exposed material at its exposed surface. For example, an exposed substantially crystalline region will have its exposed surface having at least 90% crystallinity, while an exposed substantially amorphous region will have its exposed surface being at least 90% amorphous. Also in the context of this document, "predominately" means greater than 50%.

Further in the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
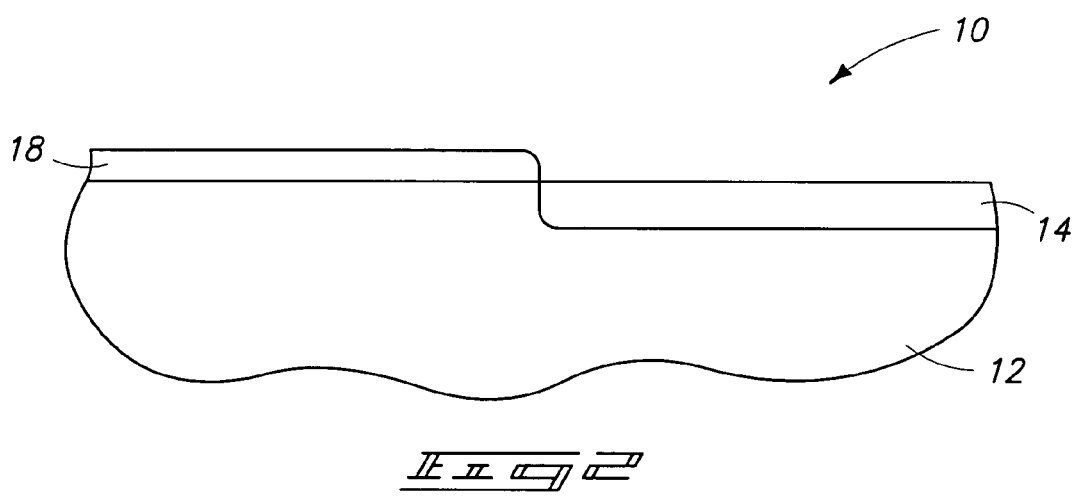
FIG. 2 is a view of the FIG. 1 wafer fragment at a processing step subsequent to that depicted by FIG. 1.

Referring to FIG. 2, wafer 10 is provided within a chemical vapor deposition reactor. Preferably, the wafer has been subjected to a native oxide strip, such as by using an HF dip, immediately prior to placement with the reactor. A gaseous precursor comprising silicon is fed to the reactor under conditions effective to substantially selectively deposit a polysilicon layer 18 on crystalline region 16 and not on amorphous region 14. In the context of this document, "substantially selective" or "substantially selectively" denotes deposition over one region as compared to another to a thickness ratio of greater than 5:1. An example and preferred reactor is a hot wall low pressure chemical vapor deposition reactor, with the processing conditions being void of plasma generation. Alternately, plasma can be utilized. Exemplary and suitable conditions within the reactor comprise a temperature of greater than or equal to about 650° C. and a pressure less than or equal to about 100 mTorr. A preferred upper temperature limit is 850° C. Also preferably, pressure is greater than 30 mTorr and temperature is less than 800° C. during deposition, thus overcoming the extreme low pressure/ high temperature environments (and thus costs associated therewith) of the prior art epitaxial silicon deposition processes. Accordingly in one implementation, the invention enables use of conventional, lower cost deposition furnaces instead of the ultra high vacuum rapid thermal epi reactors.

Example preferred silicon precursors include silanes, including chlorosilanes. Specific examples include $SiH_4$, $Si_2H_6$, and $SiCl_2H_2$. However most preferably, the deposition conditions are void of feeding chlorine containing gas to the reactor thus eliminating any tendency of the substrate being etched during the selective deposition. The invention was reduced to practice utilizing a vertical hot wall LPCVD reactor holding 100 wafers. The feed gas was $SiH_4$ at 50 sccm, with the atmosphere within the reactor during processing consisting entirely or essentially of such gaseous silane precursor. Temperature during processing was 700° C., with pressure being substantially maintained at 70 mTorr. An exemplary broader range for gas flow is from about 20 sccm to about 1000 sccm. Under such conditions, near 100% selectivity in the deposition was achieved (i.e., essentially no deposition over region 14) during deposition of the first 1500 Angstroms of polysilicon. Above this thickness, polysilicon began to deposit on region 14, which comprised undoped $SiO_2$. Modifying process conditions by one or both of raising temperature and lowering pressure will have greater improvement on selectivity as a function of thickness. Regardless, such reduction-to-practice example conditions in the subject reactor do have significant utility, as present and future generations of semiconductor wafer fabrication comprises deposition of polysilicon layers to less than 1000 Angstroms.

Alternate exposed crystalline surfaces, by way of example only, utilizable in the context of the invention include silicides (such as $TiSi_x$ and $WSi_4$), crystalline dielectrics (such as barium strontium titanate and $Ta_2O_5$), aluminum, copper, aluminum-copper alloys, tungsten, and other crystalline metals or metal-like materials. Selectivity in the deposition is expected to be greatest where the reactor atmosphere during the time period of deposition is substantially void of a gas comprising a conductivity enhancing dopant, or other gases, although conductivity enhancing gases (such as $B_2H_6$) are expected to provide functional selectivity in accordance with the invention.

Figure 3:
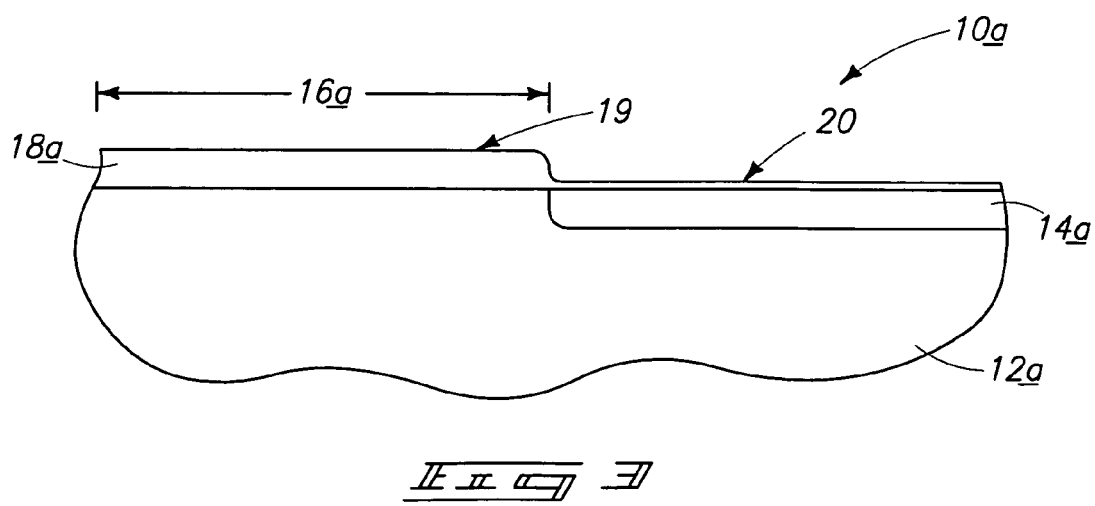
FIG. 3 is an alternate view of the FIG. 1 wafer fragment at an alternate processing step subsequent to that depicted by FIG. 1.

An alternate considered embodiment is described with reference to FIG. 3 which illustrates a semiconductor wafer fragment 10a. Like numerals from the first described embodiment are utilized where appropriate, with differences being indicated with the suffix "a" or with different numerals. In this example, materials 12a (and correspondingly exposed region 16a) and 14a can be considered as presenting exposed predominately crystalline and predominately amorphous regions, respectively. Such regions could also constitute exposed substantially crystalline and substantially amorphous regions, respectively. Within a chemical vapor deposition reactor, a gaseous silicon precursor is fed under conditions effective to deposit a polysilicon layer 18a on both the exposed crystalline and amorphous regions. Polysilicon layer 18a has a region 19 within the previously exposed at least predominately crystalline region 16a and a region 20 over the exposed at least predominately amorphous region. Deposited polysilicon region 19 has a greater thickness than deposited polysilicon region 20. Region 20 can be subsequently removed if desired.

In accordance with the reduction to practice example, such was achieved with a silane flow rate at 50 sccm with reactor temperature and pressure during processing being maintained at 700° C. and 70 mTorr, respectively, when the thickness of region 18a reached about 1500 Angstroms. In such reduction-to-practice example, exposed region 16a was substantially crystalline and region 14a was substantially amorphous. Modifying deposition conditions by one or both of lowering temperature and raising pressure will result in lowering of the threshold thickness upon which appreciable deposition begins relative to the exposed amorphous region. Further, modifying crystalline/amorphous content of the exposed surface(s) by reducing the degree of crystallinity below 90% in region 16a and reducing amorphous content to below 90% in region 14a would further impact by lowering the threshold thickness limit where appreciable polysilicon begins to develop on the exposed predominately amorphous region.

Figure 4:
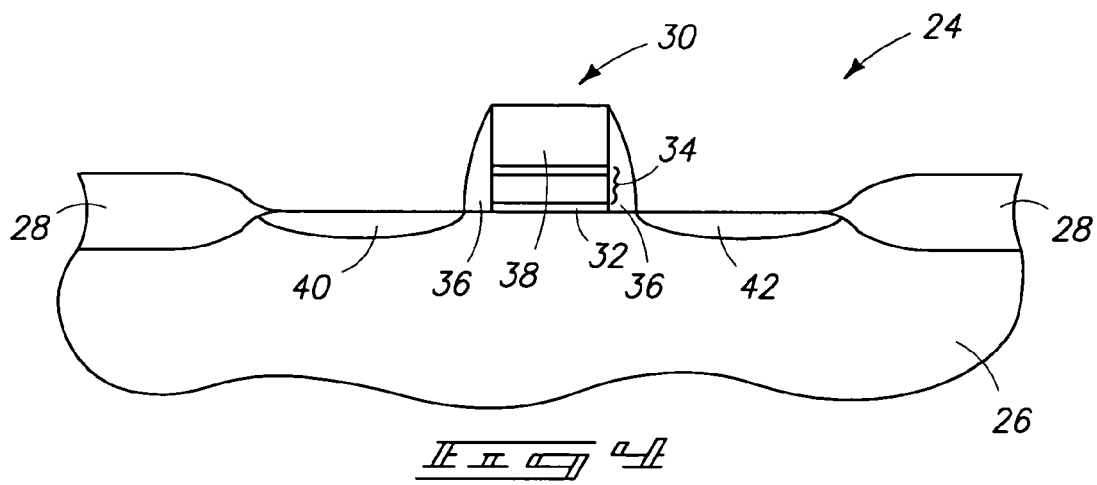
FIG. 4 is a diagrammatic view of an alternate embodiment semiconductor wafer fragment at a processing step in accordance with an aspect of the invention.

The invention can have applicability, for example, in fabrication of field effect transistors, such as will now be described with reference to FIGS. 4 and 5. FIG. 4 illustrates a semiconductor wafer fragment 24 comprised of a bulk monocrystalline silicon substrate 26 having isolation regions 28 formed therein. A gate construction 30 is provided centrally between isolation regions 28. Such comprises a gate dielectric layer 32 and a gate 34 provided thereover. Gate 34 preferably comprises a silicide layer over a polysilicon layer. Substantially amorphous insulating material, such as $Si_3N_4$ in the illustrated form of anisotropically etched sidewall spacers 36 and cap 38, is provided over and laterally proximate gate 34, with the illustrated gate construction 30 being provided over semiconductive material 26. Doped source/drain regions 40 and 42 are formed within semiconductive material 26 laterally proximate the illustrated gate.

Figure 5:
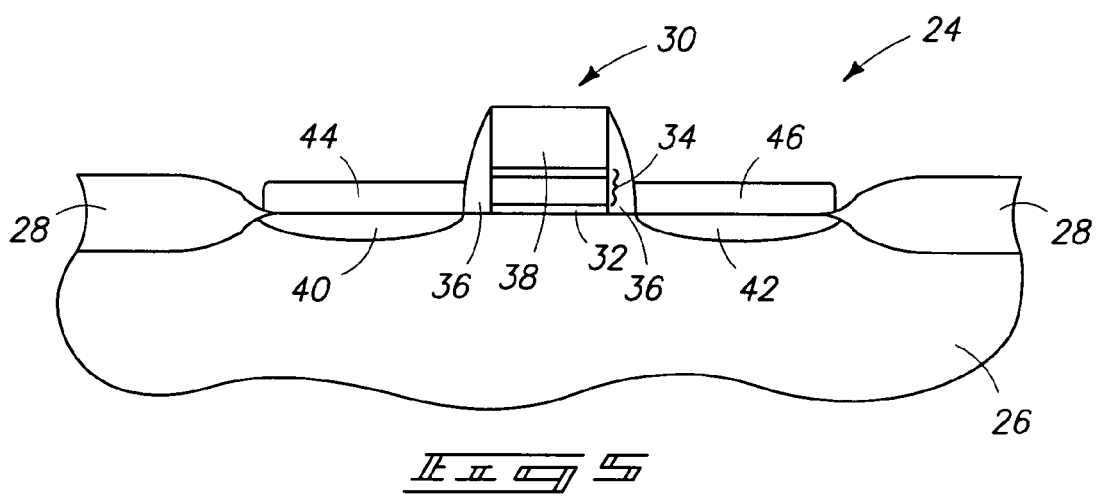
FIG. 5 is a view of the FIG. 4 wafer fragment at a processing step subsequent to that shown by FIG. 4.

Referring to FIG. 5, wafer 24 has been provided within a chemical vapor deposition reactor and processed as described above effectively to substantially selectively deposit polysilicon on source/drain regions 40 and 42, and not on the substantially amorphous material of regions 28, 36 and 38. Elevated source/drain regions 44 and 46 are formed on doped source/drain regions 40 and 42, respectively. An example and preferred thickness for the entirety of each region 40/44, and 42/46 is 500 Angstroms. As an alternate example, doping to fully form regions 40 and 42 could occur after provisions of elevated regions 44 and 46.

Figure 6:
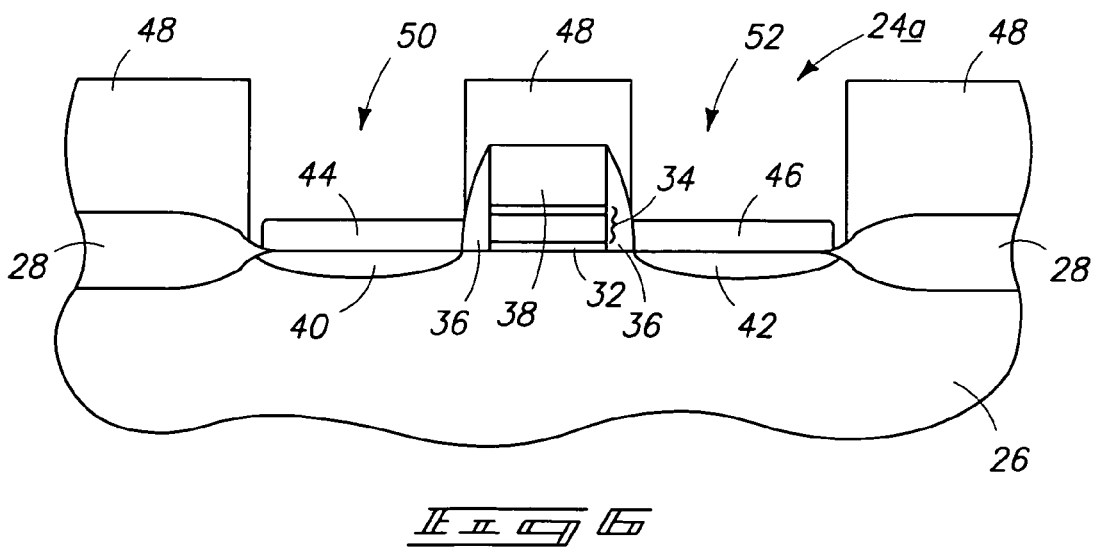
FIG. 6 is a diagrammatic sectional view of yet another alternate embodiment wafer fragment at a processing step in accordance with an aspect of the invention.

FIG. 6 illustrates exemplary alternate processing relative to a wafer fragment 24a. Like numerals from the FIGS. 4 and 5 embodiment are utilized where appropriate, with differences being indicated with a suffix "a", or with different numerals. Wafer fragment 24a is the same as that depicted in FIG. 4, and additionally includes formation of a substantially amorphous insulating material layer 48 (for example such as $SiO_2$, doped or undoped, or $Si_3N_4$) thereover. Openings 50 and 52 have been etched through amorphous insulating material layer 48 over the illustrated source/drain regions to expose such regions, while leaving the gate protectively covered with amorphous insulating material. Processing would then continue as described above with respect to FIG. 5, with the elevated source/drain regions forming as described above (not shown in FIG. 6). Such processing might be desired where other portions of the wafer are desired to be masked during the substantially selective polysilicon deposition, or where polysilicon growth is desired on less than all of the exposed source/drain regions or other crystalline material regions which would be exposed but for provision of layer 48.

Figure 7:
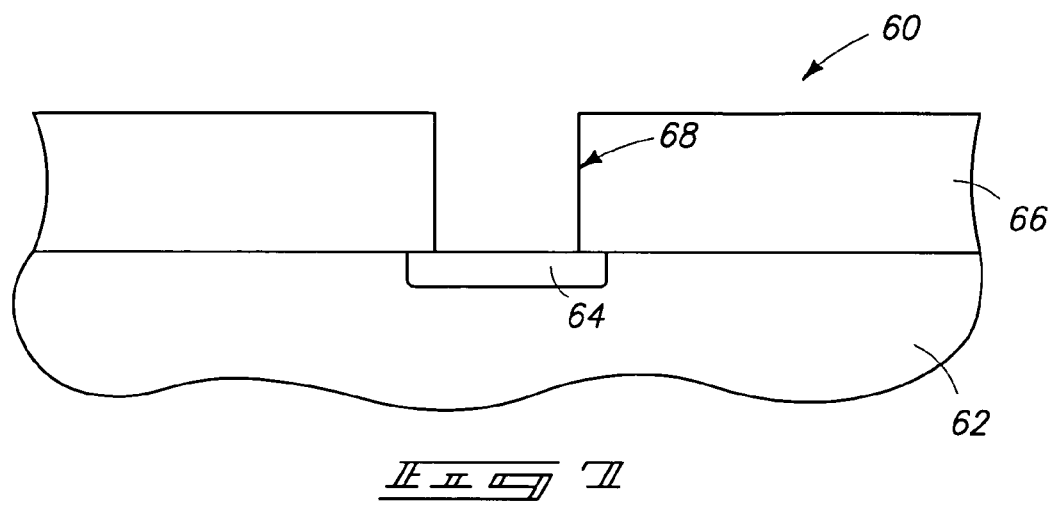
FIG. 7 is a diagrammatic sectional view of still another alternate embodiment wafer fragment at a processing step in accordance with an aspect of the invention.

Further exemplary processing is next described with reference to FIGS. 7 and 8 relative to a wafer fragment 60. Such comprises a crystalline substrate 62 having a conductive diffusion region 64 formed therein. In this example, the crystalline silicon is monocrystalline silicon, but other substrates could be utilized where the node location of interest is polycrystalline silicon. Region 64 constitutes a substrate node location to which electrical contact is desired. A substantially amorphous insulating material layer 66 is formed over substrate node location 64, and a contact opening 68 is etched through such material over node location 64, and in this example, all the way to the crystalline silicon of node location 64.

Figure 8:
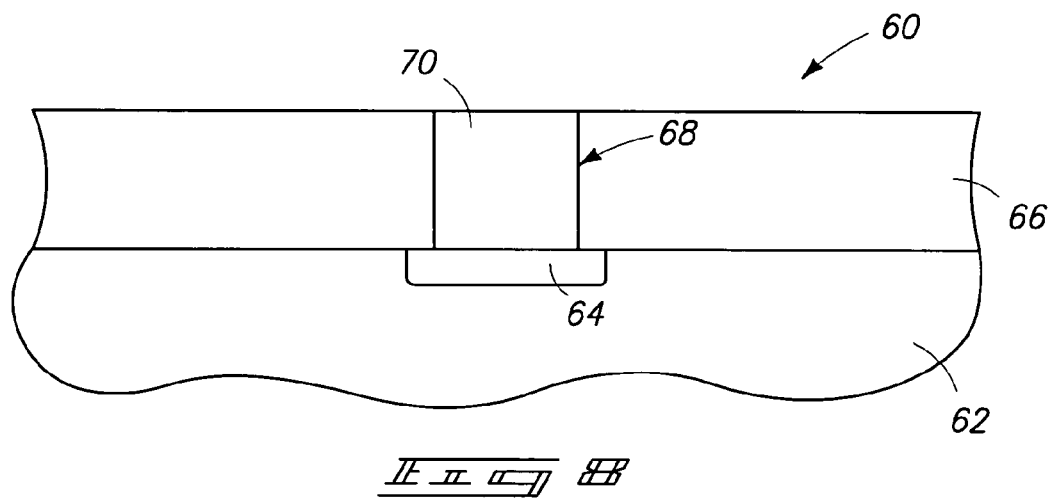
FIG. 8 is a view of the FIG. 7 wafer fragment at a processing step subsequent to that shown by FIG. 7.
Figure 9:
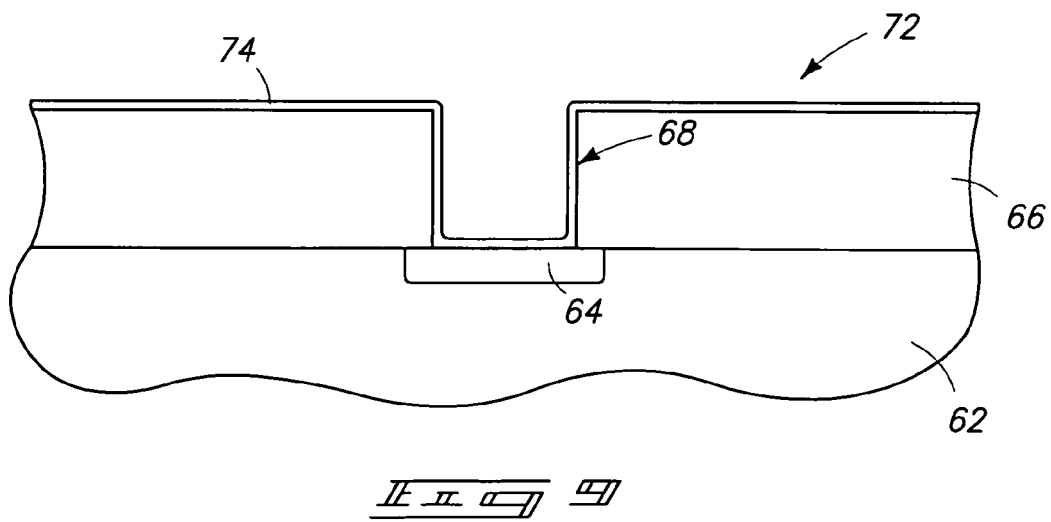
FIG. 9 is yet another view of an alternate embodiment semiconductor wafer fragment at a processing step in accordance with an aspect of the invention.

Referring to FIG. 8, substrate 60 has been provided within a chemical vapor deposition reactor and processing conducted, as for example as described above, effectively to substantially selectively deposit polysilicon 70 within contact opening 68 on crystalline silicon of node location 64, and not on insulating material 66.

Further alternate processing is described with reference to FIGS. 9-12 with respect to a semiconductor wafer fragment 72. Like numerals from the first described embodiment have been utilized where appropriate with differences being indicated with the suffix "a" or with different numerals. Wafer fragment 72 appears as wafer fragment 60 of FIG. 7 at a processing step immediately subsequent thereto. Specifically, wafer fragment 72 includes a deposited metal layer 74, such as Ti or W.

Figure 10:
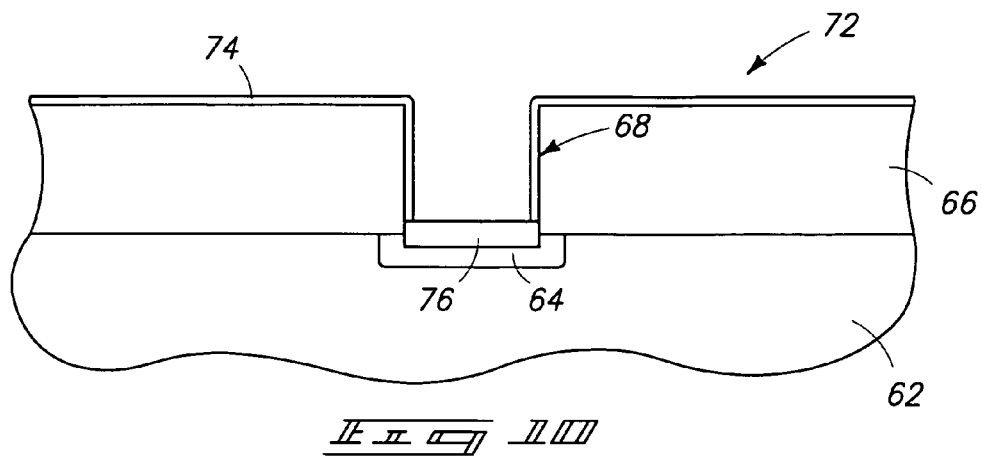
FIG. 10 is a view of the FIG. 9 wafer fragment at a processing step subsequent to that depicted by FIG. 9.
Figure 11:
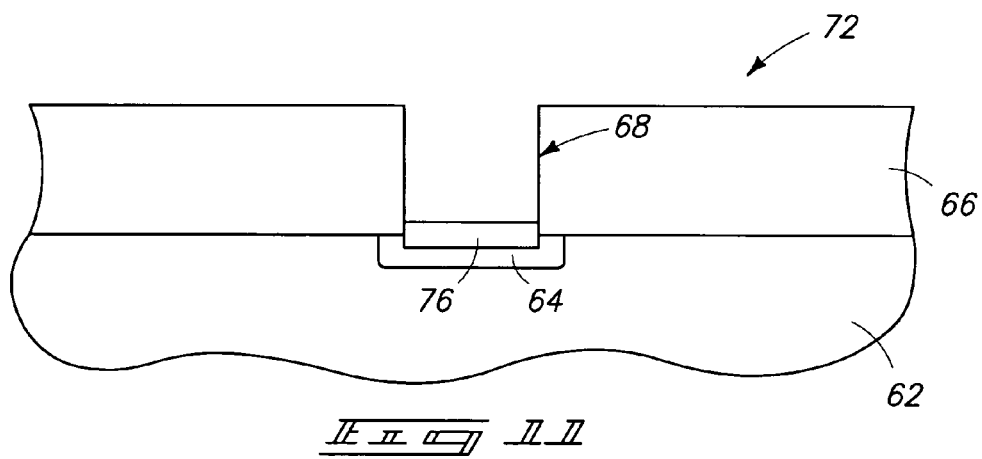
FIG. 11 is a view of the FIG. 9 wafer fragment at a processing step subsequent to that depicted by FIG. 10.

Referring to FIGS. 10 and 11, wafer fragment 72 has been subjected to, for example, conventional SALACIDE processing to form a silicide region 76 at the base of contact opening 68. Metal layer 74 is thereafter stripped (FIG. 11) to leave silicide region 76 at the base of contact 68. Such provides a node location at the base of contact 68 which, in this example, comprises an outwardly exposed substantially crystalline surface in the form of a silicide.

Figure 12:
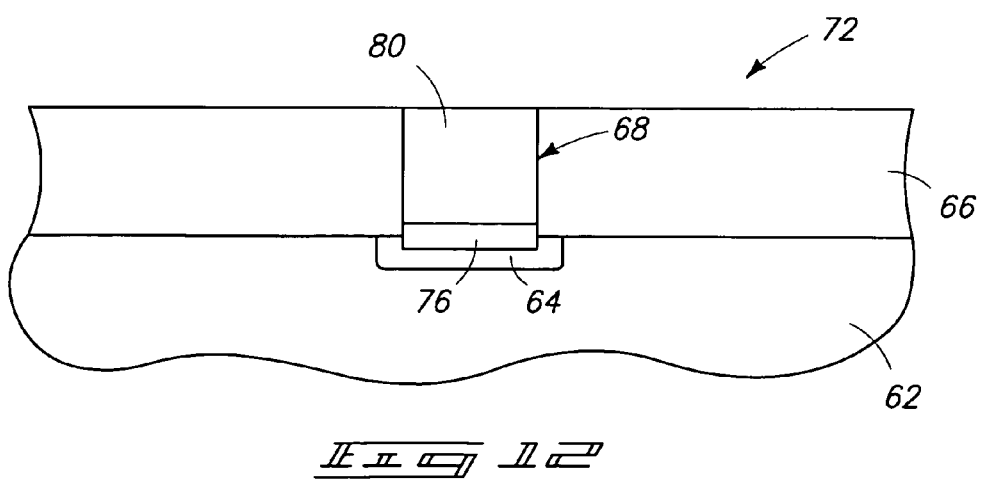
FIG. 12 is a view of the FIG. 9 wafer fragment at a processing step subsequent to that depicted by FIG. 11.

Referring to FIG. 12, wafer fragment 72 has been provided within a chemical vapor deposition reactor and conditions provided to be effective to substantially selectively deposit polysilicon 80 on the outwardly exposed silicide node location surface and not on insulating material 66.

Figure 13:
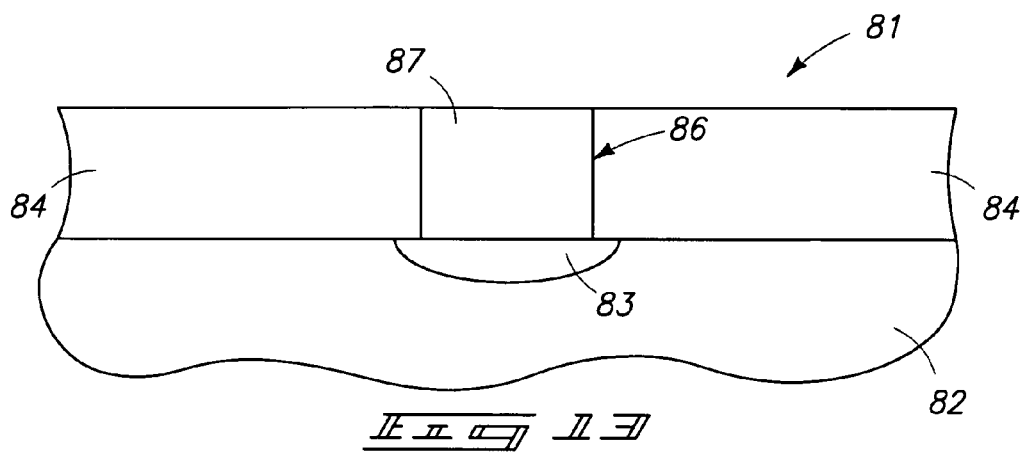
FIG. 13 is still another view of an alternate embodiment semiconductor wafer fragment at a processing step in accordance with an aspect of the invention.

Further alternate processing is next described with reference to FIGS. 13-15 regarding methods of forming a capacitor. FIG. 13 illustrates a semiconductor wafer fragment 81 comprised of bulk monocrystalline silicon 82 having a diffusion region 83 formed therein. A layer of amorphous silicon dioxide 84 is formed thereover. A contact opening 86 is etched through layer 84 to diffusion region 83. Opening 86 is plugged with a crystalline material 87, such as conductive polysilicon, and planarized relative to layer 84.

Figure 14:
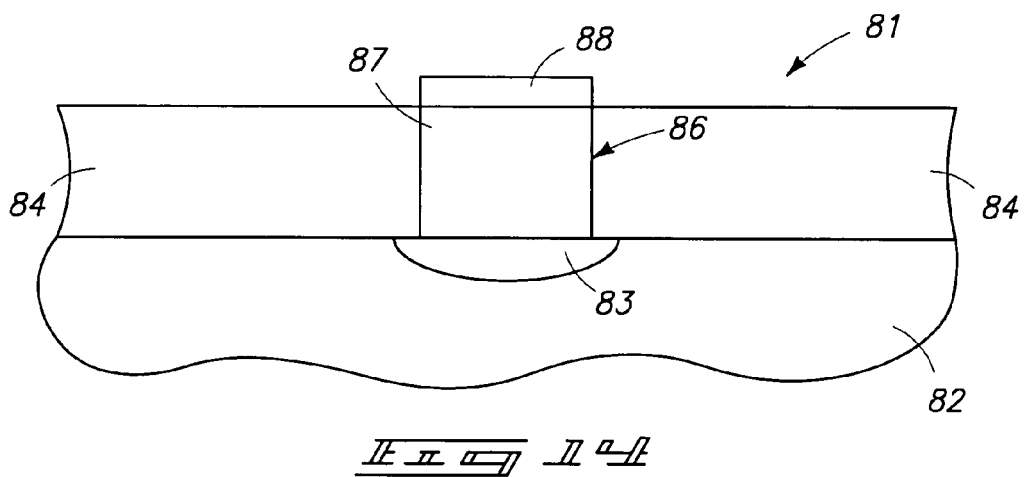
FIG. 14 is a view of the FIG. 13 wafer fragment at a processing step subsequent to that depicted by FIG. 13.

Referring to FIG. 14, substrate 81 has been placed within a chemical vapor deposition reactor and processed as described above to selectively deposit polysilicon 88 over crystalline material 87. Polysilicon 88 can be further processed, such as by patterning, to form a desired first capacitor electrode shape if the initial deposition is not as desired.

Figure 15:
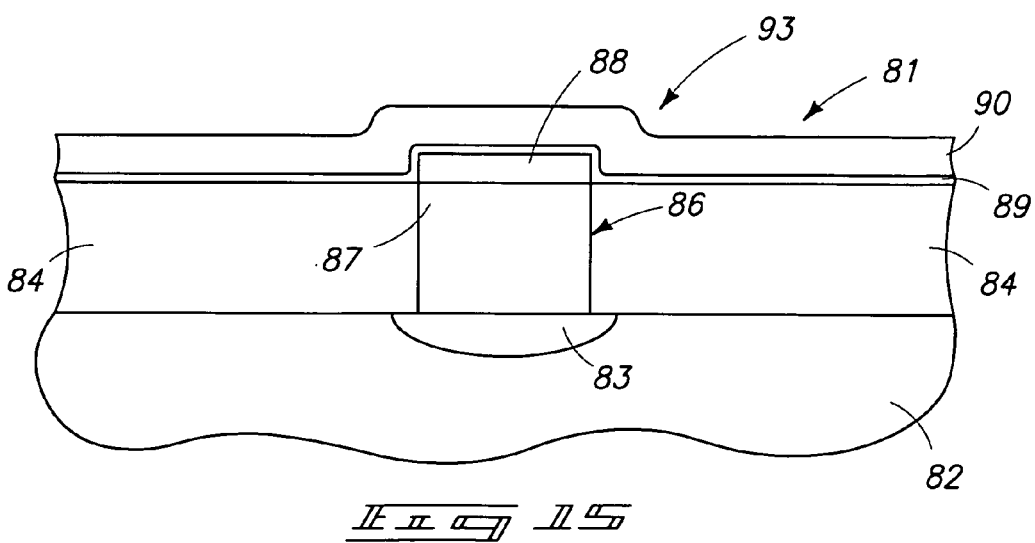
FIG. 15 is a view of the FIG. 13 wafer fragment at a processing step subsequent to that depicted by FIG. 14.
Figure 16:
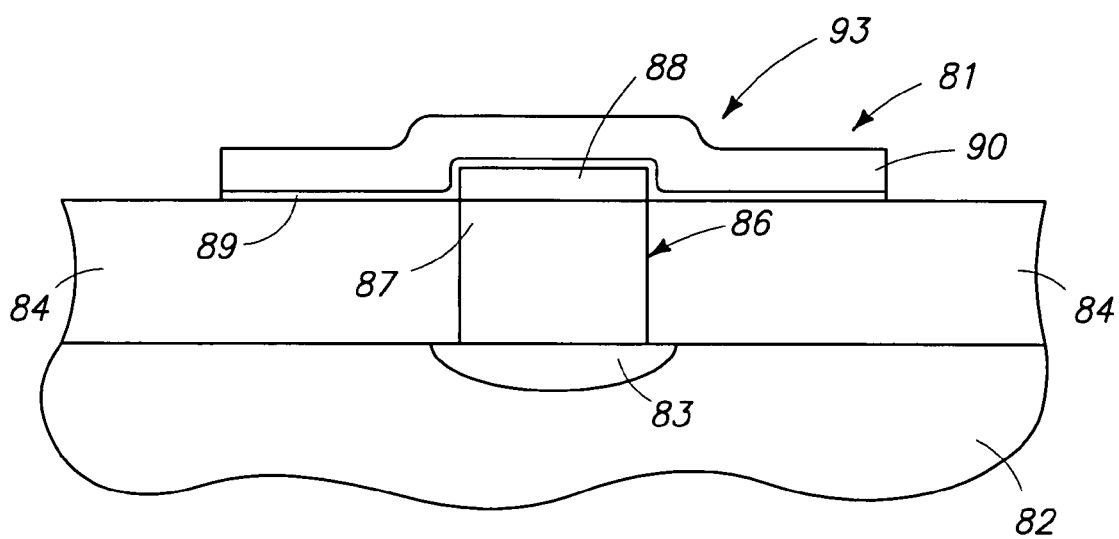
FIG. 16 is an alternate view of that depicted by FIG. 15.

Referring to FIG. 15, a capacitor dielectric layer 89 is deposited followed by deposition of a second capacitor electrode layer 90 to form a capacitor 93. Such can be formed by conventional or other processing. For example, techniques of the invention as described above can be utilized to selectively deposit second capacitor electrode layer 90 on dielectric layer 89 where such is fabricated to be crystalline. For example, barium strontium titanate and $Ta_2O_5$ are exemplary crystalline capacitor dielectric layer materials. Such material can be deposited over first capacitor electrode 88, patterned if desired to provide exposed amorphous material and the crystalline material 89 where desired, and a selective deposition (FIG. 16) as described above then conducted.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a capacitor comprising:
forming a first capacitor electrode and substantially amorphous material over a substrate, the substantially amorphous material being separate from and not constituting a portion of the first capacitor electrode;
forming a substantially crystalline capacitor dielectric layer over the first capacitor electrode and the substantially amorphous material;
outwardly exposing an elevationally outer surface of the substantially amorphous material;
providing the substrate with substantially crystalline capacitor dielectric layer and the substantially amorphous material having the exposed elevationally outer surface within a chemical vapor deposition reactor; and
while the elevationally outer surface of the substantially amorphous material is outwardly exposed, feeding a gaseous precursor comprising silicon to the chemical vapor deposition reactor under conditions which substantially selectively deposit polysilicon on the substantially crystalline capacitor dielectric layer relative to the outwardly exposed elevationally outer surface of the substantially amorphous material, and forming the polysilicon into a second capacitor electrode.

2. The method of claim 1 wherein the conditions comprise pressure greater than 30 mTorr and temperature of less than 800° C.

3. The method of claim 1 wherein the conditions are void of feeding chlorine-containing gas to the chemical vapor deposition reactor.

4. The method of claim 1 wherein the crystalline capacitor dielectric layer comprises barium strontium titanate.

5. The method of claim 1 wherein the crystalline capacitor dielectric layer comprises $Ta_2O_5$.

6. The method of claim 1 wherein the gaseous precursor comprising silicon comprises a silane.

7. The method of claim 6 wherein the gaseous precursor comprises a chlorosilane.

8. The method of claim 1 wherein the gaseous precursor comprising silicon comprises a silane, and the conditions include a chemical vapor deposition reactor atmosphere during depositing consisting essentially of gaseous silane precursor.

9. The method of claim 1 wherein the conditions comprise temperature of less than 800° C. and pressure greater than 30 mTorr, and wherein the gaseous precursor comprising silicon comprises a silane, and the conditions include a chemical vapor deposition reactor atmosphere during depositing consisting essentially of the silane.

10. The method of claim 1 wherein the conditions comprise pressure greater than 30 mTorr.

11. The method of claim 1 wherein the conditions are void of plasma.

12. The method of claim 1 wherein the conditions are substantially void of gas comprising a conductivity enhancing dopant.

13. The method of claim 1 wherein the conditions comprise a gas comprising a conductivity enhancing dopant.

14. The method of claim 1 wherein the conditions comprise temperature of greater than or equal to about 650° C.

15. The method of claim 1 wherein the conditions comprise pressure less than or equal to about 100 mTorr.

16. The method of claim 1 wherein the conditions comprise a temperature of from about 650° C. to about 850° C. and a chemical vapor deposition reactor pressure at less than or equal to about 100 mTorr.

17. The method of claim 1 wherein the exposed substantially amorphous material comprises $SiO_2$.

18. The method of claim 1 comprising patterning the capacitor dielectric layer prior to said feeding.

19. The method of claim 18 wherein no polysilicon is deposited on the exposed substantially amorphous material.

20. The method of claim 18 wherein the crystalline capacitor dielectric layer comprises barium strontium titanate.

21. The method of claim 18 wherein the crystalline capacitor dielectric layer comprises $Ta_2O_5$.

* * * * *